(12) United States Patent
Breicher et al.

(10) Patent No.: US 11,310,903 B2
(45) Date of Patent: Apr. 19, 2022

(54) MULTI-ZONE HEAT SINK FOR PRINTED CIRCUIT BOARDS

(71) Applicant: dSPACE digital signal processing and control engineering GmbH, Paderborn (DE)

(72) Inventors: Robert Breicher, Paderborn (DE); Van Son Nguyen, Paderborn (DE); Johannes Henkel, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 17/128,762

(22) Filed: Dec. 21, 2020

(65) Prior Publication Data

US 2021/0195727 A1    Jun. 24, 2021

(30) Foreign Application Priority Data

Dec. 19, 2019   (DE) ..................... 10 2019 135 060.3

(51) Int. Cl.
*H05K 1/02* (2006.01)
*H05K 7/20* (2006.01)
*H05K 1/18* (2006.01)

(52) U.S. Cl.
CPC ........... *H05K 1/0203* (2013.01); *H05K 1/181* (2013.01); *H05K 7/2039* (2013.01); *H05K 7/20518* (2013.01); *H05K 2201/066* (2013.01)

(58) Field of Classification Search
CPC . H01L 23/467; H01L 23/3672; H01L 23/367; G06F 1/20; G06F 1/203; H05K 7/2039; H05K 7/20409; H05K 7/20418; H05K 7/20154; H05K 7/205; H05K 7/20518; H05K 2201/066
See application file for complete search history.

(56) References Cited

U.S. PATENT DOCUMENTS

| | | | | |
|---|---|---|---|---|
| 5,602,392 A | * | 2/1997 | Owen | ............... H01L 27/14623 250/332 |
| 6,625,025 B1 | | 9/2003 | Duxbury et al. | |
| 6,836,409 B1 | * | 12/2004 | Duxbury | ............. G02B 6/4277 165/185 |
| 6,999,312 B1 | * | 2/2006 | Garnett | ................. H01L 23/467 165/80.3 |

(Continued)

FOREIGN PATENT DOCUMENTS

EP    2525404 A1    11/2012

OTHER PUBLICATIONS

German Office Action dated Dec. 2, 2020 in corresponding applicaton 102019135060.3.

*Primary Examiner* — Adam B Dravininkas
(74) *Attorney, Agent, or Firm* — Muncy, Geissler, Olds & Lowe, P.C.

(57) ABSTRACT

A heat sink with a first sub-area and a second sub-area, designed for contacting a large area of a printed circuit board populated with electronic components. A thermal isolation extends between the first sub-area and the second sub-area, and a rigid mechanical connection that spans the thermal isolation connects the first sub-area to the second sub-area. As a result, the heat sink allows an assignment of sub-areas to electronic components on the printed circuit board, and contributes to mechanical stabilization of the printed circuit board.

7 Claims, 2 Drawing Sheets

(56) References Cited

U.S. PATENT DOCUMENTS

| | | | | |
|---|---|---|---|---|
| 7,755,895 | B2* | 7/2010 | Ikeda | H01L 23/36 |
| | | | | 361/704 |
| 8,913,389 | B2* | 12/2014 | Fukui | H05K 7/20518 |
| | | | | 361/710 |
| 9,129,885 | B2 | 9/2015 | Nakayama et al. | |
| 9,167,723 | B1* | 10/2015 | Kim | H01L 23/3738 |
| 10,031,565 | B1* | 7/2018 | Han | G06F 1/20 |
| 10,345,874 | B1* | 7/2019 | Narasimhan | H01L 23/3672 |
| 10,477,728 | B2* | 11/2019 | Yatskov | H01L 23/4006 |
| 2015/0373827 | A1* | 12/2015 | Guo | H05K 1/0201 |
| | | | | 361/704 |
| 2017/0352605 | A1* | 12/2017 | Bilan | H01L 23/3672 |
| 2018/0249591 | A1* | 8/2018 | Audemar | H05K 7/209 |

* cited by examiner

MULTI-ZONE HEAT SINK FOR PRINTED CIRCUIT BOARDS

This nonprovisional application claims priority under 35 U.S.C. § 119(a) to German Patent Application No. 10 2019 135 060.3, which was filed in Germany on Dec. 19, 2019, and which is herein incorporated by reference.

BACKGROUND OF THE INVENTION

Field of the Invention

The present invention relates to thermal management of computer systems.

Description of the Background Art

Numerous computer systems developed for outdoor use in vehicles are found on the market, for example the DRIVE AGX platform from NVIDIA, the "Rugged Embedded Computer" line by Crystal Group, and the Autera AutoBox from dSPACE. Typical requirements for such computer systems are compactness in order to be able to use them in cramped conditions, as well robustness and vibration resistance. Particularly because of current efforts to develop highly automated vehicles, there is a demand for such development systems designed for outdoor use that are additionally equipped with high computing capacity and therefore require high-performance cooling. For reasons to be explained below, the latter requirement conflicts with the previously mentioned requirements for compactness, robustness, and vibration resistance.

From the prior art, passive heat sinks are known for large-area contact on printed circuit boards populated with electronic components in computer systems, for example the ICY BOX IB-M2H2-100 model from RaidSonic. Such heat sinks absorb the waste heat of the electronic components in order to dissipate it to the ambient air. The heat sinks can be arranged in an airflow for removal of the waste heat. In general, different electronic components with different waste heat outputs and different temperature tolerances are installed on a printed circuit board. The mounting of a heat sink can even be counterproductive, therefore, because the heat sink transports waste heat from high-performance components to components with low temperature tolerance, thus acting as a heater from the viewpoint of the latter. Measures known from the prior art to counteract this effect are based on improving the overall cooling capacity, for example by using a larger heat sink, a high-performance fan for producing a stronger airflow, or an active heat sink that is equipped with a heat pump, a fan, or a piezoelectric element. All these measures increase the space required by the cooling system, however, and thus adversely affect the compactness of the computer system.

SUMMARY OF THE INVENTION

It is therefore an object of the present invention to reduce the space required by high-performance computer systems designed for outdoor use.

To attain the object, a heat sink for contacting a large area of a printed circuit board populated with electronic components is proposed that has multiple sub-areas that are thermally isolated/insulated from one another, such that a thermal bridge between the sub-areas is avoided, wherein each sub-area is arranged to absorb waste heat only from a subset of the electronic components arranged on the printed circuit board. The heat sink accordingly comprises at least a first sub-area for absorption of waste heat from a first number of electronic components of the printed circuit board, and a second sub-area for absorption of waste heat from a second number of electronic components of the printed circuit board. Arranged between the first and second sub-areas is a thermal isolator/insulator, which has a substantially reduced thermal conductivity as a whole in comparison with the two sub-areas, and thus substantially limits the heat exchange between the first sub-area and the second sub-area. The heat sink additionally comprises a rigid mechanical connection between the first sub-area and the second sub-area that spans the thermal isolation.

A rigid mechanical connection can be understood to mean that the mechanical connection is designed to be largely stiff and free of play, and thus holds the first sub-area and the second sub-area in a predetermined rest position relative to one another even under the influence of a bending moment on the heat sink that is strong but is to be expected in the intended use of the printed circuit board.

A heat sink designed according to the invention makes it possible to assign portions of the overall area of the heat sink exclusively to individual components on the printed circuit board or to groups of components, and in this way to better cool especially temperature-sensitive components or to prevent especially temperature-sensitive components from being heated by the heat sink through thermal conduction from other components on the printed circuit board. For example, the subsections can be spatially arranged and dimensioned such that the first sub-area absorbs waste heat from a first electronic component on a given printed circuit board, and the second sub-area absorbs waste heat from a second electronic component on the same printed circuit board. If the temperature tolerance of the first component is higher than that of the second component, then the first component can be assigned a relatively small portion of the overall area of the heat sink—measured in terms of the waste heat output of the first component—through suitable dimensioning of the first subsection in favor of the second component, which can be assigned a relatively large subsection of the overall area for more effective cooling. During ongoing operation of the printed circuit board and once thermal equilibrium has been reached, the temperature of the first sub-area is then higher than that of the second sub-area, preferably just below the highest tolerable temperature in the interest of effective area utilization.

Due to the mechanical connections, the heat sink according to the invention retains the same stabilizing, reinforcing effect on the printed circuit board as is possessed by the known prior art heat sinks according to the previous description. The technical effect explained in the above paragraph could of course also be achieved through the contact of multiple smaller heat sinks placed on the printed circuit board. Vibration tests carried out by the applicant during the course of developing the Autera AutoBox routinely resulted in damage to such printed circuit boards populated with heat sinks, however, whereas printed circuit boards populated with heat sinks according to the invention had adequate stability.

The thermal isolation is advantageously designed as a gap in the heat sink that extends between the first subsection and the second subsection and consequently forms an air gap arranged between the two subsections. This embodiment is simple to construct and at the same time achieves good thermal isolation with which a heat exchange between the two subsections is substantially only possible through the mechanical connections.

To prevent fracture points in the heat sink, it is advantageous for the mechanical connection to transition seamlessly into the first sub-area and the second sub-area, in particular in such a manner that no transition of the mechanical connection to the first sub-area or to the second sub-area is discernible at the microscopic level. Especially advantageously, the heat sink with the first sub-area, the second sub-area, and the mechanical connection is designed as a monolithic, metallic body, which, for example, is cast in one piece or is milled in its entirety from a single piece of metal. The mechanical connection can be designed as a number of metallic bridges between the first sub-area and the second sub-area, for example.

To improve the thermal isolation, the mechanical connection can be designed with regard to its shape so as to cause turbulence in an airflow cooling the heat sink. Air turbulence arising at the mechanical connection causes a transport of more distant, and therefore cooler, air layers to the surface of the mechanical connection and thus an improved removal of heat from the mechanical connection before the heat can migrate into a sub-area, which effectively corresponds to a reduction in the thermal conductivity of the mechanical connection. For this purpose, the mechanical connection can comprise protrusions that project out of the cooling surface and have a high coefficient of aerodynamic resistance in order to promote the formation of turbulence.

Of course, a heat sink according to the invention can also comprise, in addition to the first sub-area and the second sub-area, further sub-areas that are each thermally isolated from all other sub-areas of the heat sink by thermal isolations, and that are each connected to at least one other sub-area of the heat sink by means of a rigid mechanical connection that spans the thermal isolation.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawings which are given by way of illustration only, and thus, are not limitive of the present invention.

DETAILED DESCRIPTION

Figure 1:
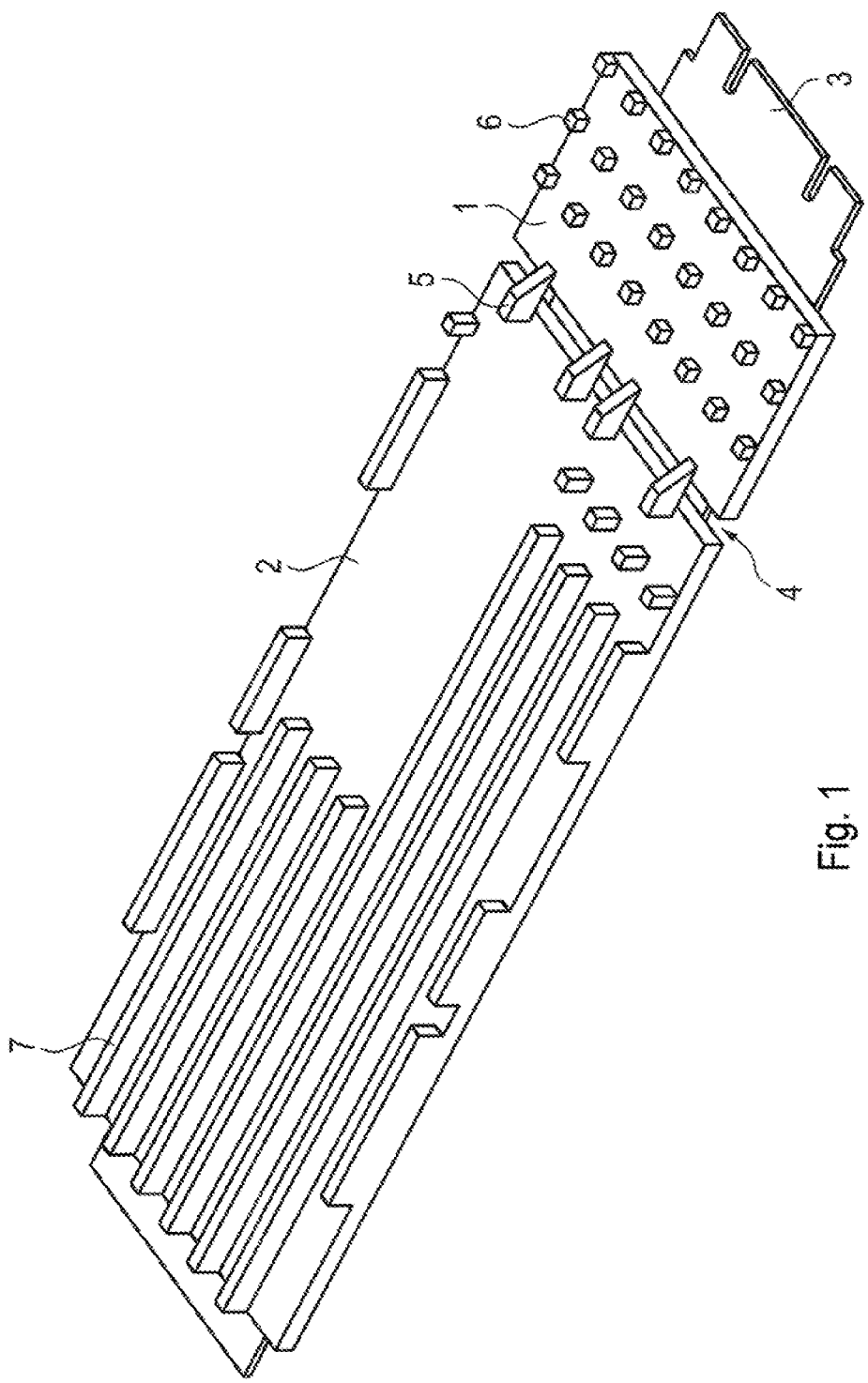
FIG. 1 shows a perspective view of a heat sink attached to a printed circuit board according to an exemplary embodiment.

In FIG. 1, a heat sink resting on a large area of a printed circuit board 3 is depicted with a first sub-area 1 and a second sub-area 2. A gap 4 that crosses the full width of the printed circuit board extends between the first sub-area 1 and the second sub-area 2; this gap forms an air gap between the first sub-area 1 and the second sub-area 2, and consequently isolates the first sub-area 1 thermally from the second sub-area 2. Four metallic bridges 5 span the gap 4 and form a mechanical connection of the first sub-area 1 to the second sub-area 2.

Figure 2:
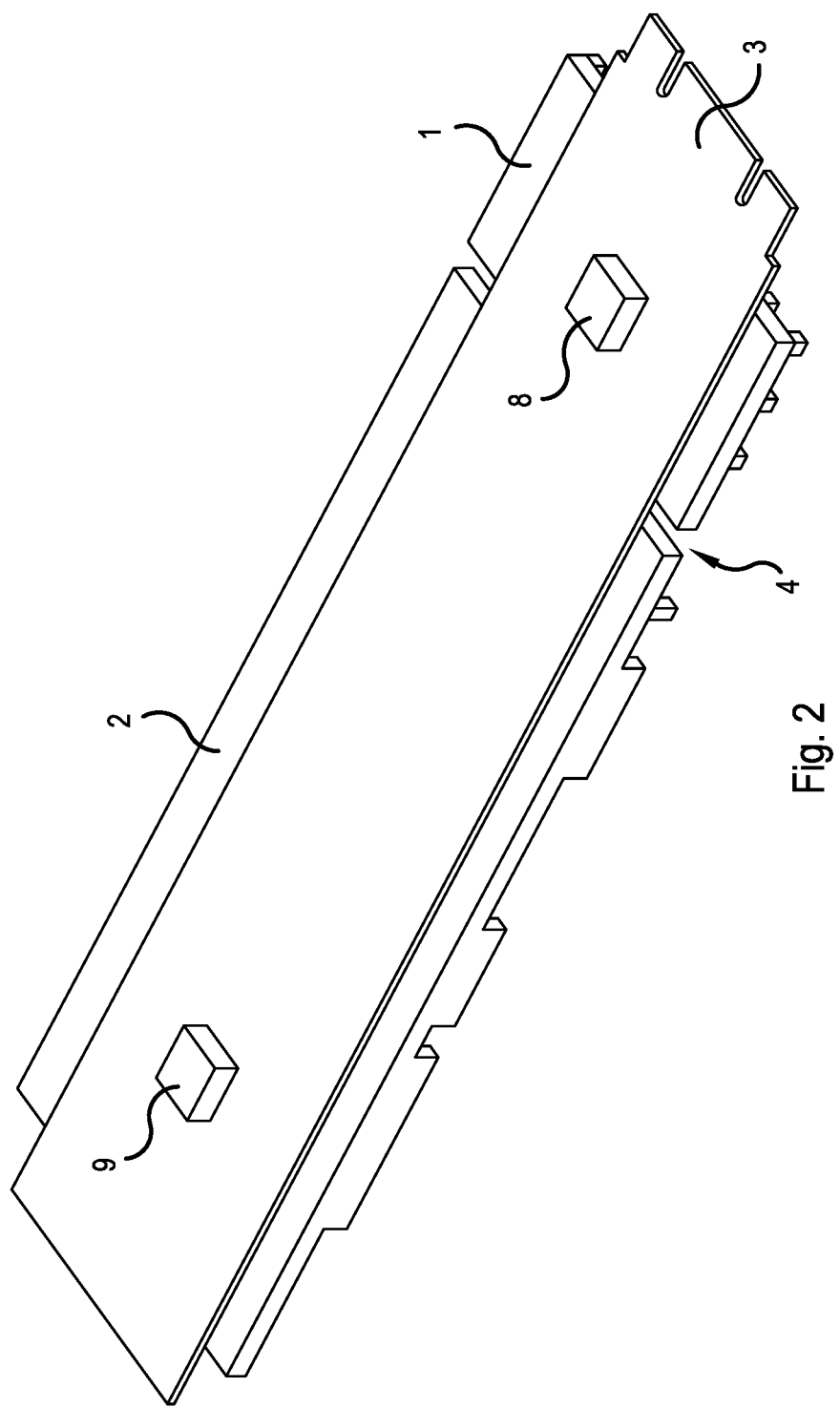
FIG. 2 shows a perspective view of the printed circuit board attached to the heat sink according to the exemplary embodiment of FIG. 1.

Arranged on the printed circuit board 3 are electronic components, not visible beneath the heat sink in FIG. 1. As shown in FIG. 2, a first electronic component 8, for example a flash controller, is arranged underneath the first sub-area 1, and a second electronic component 9, for example a flash memory chip, underneath the second sub-area 2. The flash controller can be properly operated up to an operating temperature of 125° C. In contrast, the temperature tolerance of the flash memory chip is only 70° C. The waste heat output of the flash controller and of the flash memory chip is approximately the same.

As can be seen in FIG. 1, the second sub-area 2 is larger in size than the first sub-area 1. Therefore, a larger portion of the overall area of the heat sink is assigned to the flash memory chip than the flash controller on account of its lower temperature tolerance. Consequently, after the printed circuit board is started up, the first sub-area 1 reaches a higher temperature at thermal equilibrium than the second sub-area 2. The first sub-area 1 is dimensioned such that the temperature of the first sub-area at thermal equilibrium after the printed circuit board is started up is slightly below the temperature tolerance of the flash controller, which is to say slightly below 125° C., in order to assign the more-temperature-sensitive flash memory chip the largest possible portion of the overall area of the heat sink.

If a conventional heat sink without thermal isolation 4 were used, effectively only half of the overall area of the heat sink would be assigned to the flash memory chip. The entire heat sink would then have to be made larger in size in order to adequately cool the flash memory chip, which would necessitate compromises in the compactness of the computer system in which the printed circuit board 3 is installed.

The heat sink with the first sub-area 1, the second sub-area 2, and the metallic bridges 5 is a monolithic, completely metallic body, which is milled from a single piece of metal. As a result, the bridges 5 transition seamlessly into both the first sub-area 1 and the second sub-area 2. At the microscopic level, no transition is discernible between the bridges 5 and the first sub-area 1 or the second sub-area 2. The bridges 5 thus form a rigid mechanical connection. The mechanical stiffness and freedom from play of the heat sink, and thus also the heat sink's stabilizing effect on the printed circuit board 3, consequently correspond approximately to those of a conventional heat sink without thermal isolation 4 designed for large-area contact on a printed circuit board.

The printed circuit board 3 is arranged in an airflow that cools the heat sink. The thermal isolation 4 is not perfect, of course. The first sub-area 1 and the second sub-area 2 exchange thermal energy by thermal radiation, through the bridges 5 and possibly, depending on the direction of the airflow, transport through the air. To reduce the exchange of heat by thermal conduction through the bridges 5, the bridges 5 are designed to cause turbulence in the airflow. As can be seen in FIG. 1, the bridges 5 project out of the surface of the heat sink and have many right-angled edges to promote the formation of turbulence at the bridges 5, and thereby to improve the cooling effect of the airflow at the bridges 5. The construction of the bridges 5 projecting out of the surface also increases the volume, and consequently the thermal capacity, of the bridges 5. As a whole, this construction has the effect that the heat absorbed by a bridge 5 from the first sub-area 1 is first distributed in the relevant bridge 5 and, before the second sub-area 2 can absorb it, is absorbed to a great extent by the turbulent airflow. In this way, the construction of the bridges 5 improves the thermal isolating effect of the thermal isolation 4.

To improve the cooling capacity, additional turbulence-generating elements 6 and cooling fins 7 are arranged on the heat sink.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A heat sink for contacting a large area of a printed circuit board populated with electronic components, the heat sink comprising:
    a first sub-area for absorption of waste heat from a first electronic component arranged on the printed circuit board;
    a second sub-area for absorption of waste heat from a second electronic component arranged on the printed circuit board;
    a thermal isolator to thermally isolate the first sub-area from the second sub-area; and
    a rigid mechanical connection formed between the first sub-area and the second sub-area that spans the thermal isolator,
    wherein the first sub-area and the second sub-area each have a lower surface that is connected to the printed circuit board, an upper surface that opposes the lower surface and faces away from the printed circuit board and side surfaces that connect between the upper surface and the lower surface,
    wherein the thermal isolator entirely physically separates the first sub-area from the second sub-area, such that a first one of the side surfaces of the first sub-area opposes a first one of the side surfaces of the second sub-area with the thermal isolator provided therebetween, and
    wherein the rigid mechanical connection is a bridge that extends over the thermal isolator with one end of the bridge being integral with the upper surface of the first sub-area and another end of the bridge being integral with the upper surface of the second sub-area, so that the thermal isolator extends uninterrupted along an entire length of the first one of the side surfaces of the first sub-area and an entire length of the first one of the side surfaces of the second sub-area.

2. The heat sink according to claim 1, wherein the thermal isolator is formed as a gap in the heat sink extending between the first sub-area and the second sub-area.

3. The heat sink according to claim 1, wherein the rigid mechanical connection transitions seamlessly into the first sub-area and into the second sub-area.

4. The heat sink according to claim 1, wherein the heatsink, including the first sub-area, the second sub-area and the rigid mechanical connection, is a monolithic, metallic body.

5. The heat sink according to claim 1, wherein the rigid mechanical connection is formed to cause turbulence in an airflow cooling the heat sink to increase a thermal isolating effect of the rigid mechanical connection.

6. A printed circuit board comprising:
    a first electronic component;
    a second electronic component; and
    a heat sink according to claim 1 arranged on a large area of the printed circuit board, the first sub-area being spatially arranged to absorb waste heat from the first electronic component, and the second sub-area being spatially arranged to absorb waste heat from the second electronic component.

7. The printed circuit board according to claim 6, wherein the heat sink is designed such that, by dimensioning the first sub-area and the second sub-area, a temperature of the first sub-area is higher than a temperature of the second sub-area at thermal equilibrium after the printed circuit board is in an operating state.

* * * * *